US012255235B2

(12) United States Patent
Kantarovsky

(10) Patent No.: US 12,255,235 B2
(45) Date of Patent: Mar. 18, 2025

(54) FIELD EFFECT TRANSISTORS WITH DUAL FIELD PLATES

(71) Applicant: GlobalFoundries U.S. Inc., Malta, NY (US)

(72) Inventor: Johnatan Avraham Kantarovsky, South Burlington, VT (US)

(73) Assignee: GlobalFoundries U.S. Inc., Malta, NY (US)

(*) Notice: Subject to any disclaimer, the term of this patent is extended or adjusted under 35 U.S.C. 154(b) by 494 days.

(21) Appl. No.: 17/645,738

(22) Filed: Dec. 22, 2021

(65) Prior Publication Data

US 2023/0197798 A1 Jun. 22, 2023

(51) Int. Cl.

| | |
|---|---|
| ***H01L 29/40*** | (2006.01) |
| ***H01L 21/76*** | (2006.01) |
| ***H01L 21/765*** | (2006.01) |
| ***H01L 29/423*** | (2006.01) |
| ***H01L 29/66*** | (2006.01) |
| ***H01L 29/778*** | (2006.01) |

(52) U.S. Cl.

CPC ........ *H01L 29/404* (2013.01); *H01L 21/7605* (2013.01); *H01L 21/765* (2013.01); *H01L 29/42316* (2013.01); *H01L 29/66462* (2013.01); *H01L 29/7786* (2013.01)

(58) Field of Classification Search

None

See application file for complete search history.

(56) References Cited

U.S. PATENT DOCUMENTS

| | | | | |
|---|---|---|---|---|
| 5,907,173 | A * | 5/1999 | Kwon | H01L 29/402 257/341 |
| 5,912,490 | A | 6/1999 | Hebert et al. | |
| 7,126,193 | B2 * | 10/2006 | Baiocchi | H01L 29/7835 257/E29.268 |
| 7,329,922 | B2 * | 2/2008 | Shibib | H01L 29/7831 257/E29.264 |
| 7,800,131 | B2 | 9/2010 | Miyamoto et al. | |
| 8,933,486 | B2 | 1/2015 | Wu | |
| 9,755,059 | B2 | 9/2017 | Sriram | |

(Continued)

FOREIGN PATENT DOCUMENTS

| | | | |
|---|---|---|---|
| CN | 110391293 A * | 10/2019 | H01L 29/401 |
| WO | WO-2006132418 A1 * | 12/2006 | H01L 29/402 |

OTHER PUBLICATIONS

Millimeter-wave AlGaN/GaN HEMT breakdown voltage enhancement by a recessed float field plate, Applied Physics Express, 2019, pp. 054007(1-5), vol. 12, The Japan Society of Applied Physics.

(Continued)

*Primary Examiner* — Evren Seven

(74) *Attorney, Agent, or Firm* — David Cain

(57) ABSTRACT

A transistor structure is provided, the transistor structure comprising a source, a drain, and a gate between the source and the drain. The gate may have a top surface. A first field plate may be between the source and the drain. The first field plate may be L-shaped and having a vertical portion over a horizontal portion. A top surface of the vertical portion of the first field plate may be at least as high as the top surface of the gate. A second field plate, whereby the second field plate may be connected to the gate and the second field plate may partially overlap the horizontal portion of the first field plate.

20 Claims, 9 Drawing Sheets

100 122 128t 128 126t 118Vt 118V 120t 120 126 128L 128R 118 118H 132 116 126b 112 120b 110

W1 W2 100 176a 178 176b 180 118V 122 126 128 118 120

(56) References Cited

U.S. PATENT DOCUMENTS

| | | | | |
|---|---|---|---|---|
| 10,008,561 | B2 * | 6/2018 | Kaya | H01L 29/402 |
| 2012/0126287 | A1 | 5/2012 | Aoki | |
| 2020/0350399 | A1 * | 11/2020 | Wong | H01L 29/66318 |
| 2021/0111254 | A1 | 4/2021 | Jones et al. | |

OTHER PUBLICATIONS

European Patent Office, Extended European Search Report and Opinion issued in European Patent Application No. 22198330.7 on May 12, 2023; 8 pages.

* cited by examiner

FIELD EFFECT TRANSISTORS WITH DUAL FIELD PLATES

FIELD OF THE INVENTION

The disclosed embodiments relate generally to semiconductor devices, and more particularly, to field effect transistors with dual field plates.

BACKGROUND

Compound semiconductor devices may be used for high power and/or high frequency applications. Compound semiconductor devices may refer to field effect transistors using compound semiconductors and may include heterojunction field effect transistors. The term "heterojunction" may refer to an electrical junction between two different materials, for example, semiconductors. The heterojunction field effect transistors may include high electron mobility transistors (HEMTs). In a HEMT, a two-dimensional electron gas (2DEG) may be formed at the heterojunction between two semiconductor materials with different bandgaps. The 2DEG is an accumulation layer in the undoped smaller bandgap semiconductor and may contain a relatively high sheet of electron concentration more than 1013 electrons/$cm^2$. Additionally, electrons that originate from the wider bandgap semiconductor may transfer to the 2DEG, allowing a relatively high electron mobility due to reduced ionized impurity scattering. This combination of high carrier concentration and mobility can give the HEMT a relatively large carrier transconductance and may provide a performance advantage over metal semiconductor field effect transistors (MESFETs) for high frequency applications.

The HEMT may include a gate arranged between a source and a drain. A dielectric layer may be arranged between the gate and the source and the gate and the drain. A gate to drain capacitance may limit the performance of the HEMT at high frequencies. Thereby, there is a need for an improved transistor structure to overcome the challenges mentioned above.

SUMMARY

In an aspect of the present disclosure, a transistor structure is provided, the structure comprising a source, a drain, and a gate between the source and the drain. The gate may have a top surface. A first field plate may be arranged between the gate and the drain. The first field plate may be L-shaped and having a vertical portion over a horizontal portion. A top surface of the vertical portion of the first field plate may be at least as high as the top surface of the gate. A second field plate may be connected to the gate and the second field plate may partially overlap the horizontal portion of the first field plate.

In another aspect of the present disclosure, a transistor structure is provided, the structure comprising a source, a drain, and a gate between the source and the drain. The gate may have a top surface. A first field plate may be arranged between the gate and the drain. The first field plate may be L-shaped and having a vertical portion over a horizontal portion. The vertical portion of the first field plate may have a lower portion and an upper portion. The upper portion of the vertical portion of the first field plate may be wider than the lower portion. A top surface of the vertical portion of the first field plate may be at least as high as the top surface of the gate. A second field plate may be connected to the gate and the second field plate may partially overlap the horizontal portion of the first field plate.

In yet another aspect of the present disclosure, a method of fabricating a transistor structure is provided, the method comprising forming a source and a drain. A first field plate may be formed between the source and the drain, whereby the first field plate may be L-shaped and have a horizontal portion below a vertical portion. The vertical portion of the first field plate may have a top surface. A gate may be formed between the first field plate and the source, whereby the gate may have a top surface. The top surface of the vertical portion of the first field plate may be at least as high as the top surface of the gate. A second field plate may be formed, whereby the second field plate may be connected to the gate. The second field plate may partially overlap the horizontal portion of the first field plate.

BRIEF DESCRIPTION OF THE DRAWINGS

The disclosed embodiments will be better understood from a reading of the following detailed description, taken in conjunction with the accompanying drawings.

Figure 1A:
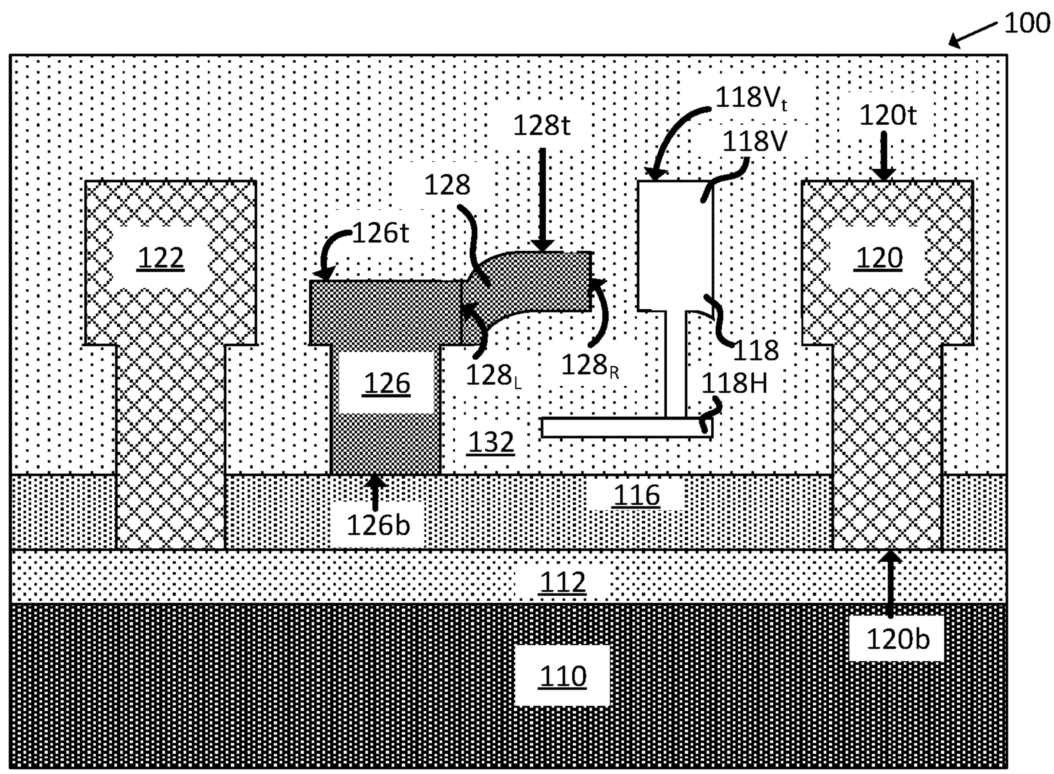
FIG. 1A shows a cross sectional view of a transistor structure, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A shows a cross sectional view of a transistor structure 100, according to an embodiment of the disclosure. The transistor structure 100 may be for a field effect transistor using compound semiconductor, for example, a heterojunction field effect transistor. The term "compound semiconductor" may refer to a semiconductor material made of chemical elements belonging to two or more different groups in the periodic table, for example, III-V semiconductor. The heterojunction field-effect transistor may include a high electron mobility transistor. The transistor structure 100 may include a gate 126 spaced from and arranged between a source 122 and a drain 120. A first field plate 118 may be arranged between the gate 126 and the drain 120. A second field plate 128 may be connected to the gate 126. The first field plate 118 may be spaced from and arranged between the second field plate 128 and the drain 120. In one embodiment, the first field plate 118 may be spaced further away from the source 122 than the drain 120. In one embodiment, the first field plate 118 may be spaced from a barrier layer 116. The first field plate 118 may have a horizontal portion 118H arranged below a vertical portion 118V. The horizontal portion 118H may be connected to the vertical portion 118V to form an L-shape. The horizontal portion 118H may extend below the second field plate 128, partially underlapping the second field plate 128. The vertical portion 118V may have a lower portion and an upper portion. The upper portion of the vertical portion 118V may be wider than the lower portion. In one embodiment, a top surface 118$V_t$ of the vertical portion 118V may be at least as high as a top surface 126*t* of the gate 126. In another embodiment, the top surface 118$V_t$ may be higher than the top surface 126*t*.

The drain 120 may have a top surface 120*t*. In one embodiment, the top surface 120*t* may be higher than the top surface 126*t* of the gate 126. In one embodiment, the top surface 120*t* may be co-planar with the top surface 118$V_t$ of the vertical portion 118V. In another embodiment, the top surface 126*t* may be higher than the top surface 120*t* and the top surface 118$V_t$ of the vertical portion 118V may be co-planar with the top surface 126*t*. The vertical portion 118V reduces capacitive coupling between the gate 126 and the drain 120, acting like a Faraday cage to prevent electromagnetic coupling between the gate 126 and the drain 120 leading to improved transistor performance at high frequencies, for example, an increase in a maximum oscillation frequency.

The gate 126 may be T-shaped, having an upper portion that is wider than its lower portion. A first end portion 128$_L$ of the second field plate 128 may be connected to the upper portion of the gate 126 to form a continuous structure. A second end portion 128$_R$ of the second field plate 128 may extend above the horizontal portion 118H of the first field plate 118. The T-shaped gate 126 and the second field plate 128 may lower a resistance of the gate 126, improving the transistor performance. In one embodiment, the horizontal portion 118H of the first field plate 118 may extend below the upper portion of the gate 126, partially underlapping the upper portion of the gate 126. The horizontal portion 118H may reduce capacitive coupling between the gate 126 and a 2-dimensional electron gas formed below the gate 126 and between the source 122 and the drain 120, leading to an improved transistor performance due to a reduced parasitic capacitance.

The second field plate 128 may have a curved shape such that a top surface 128*t* near the second end portion 128$_R$ of the second field plate 128 may be higher than the top surface 126*t* of the gate 126. The top surface 128*t* may be the highest part of the top surface of the second field plate 128 and may be substantially planar. A curved top surface of the second field plate 128 may join the top surface 128*t* and the top surface 126*t* of the gate 126. The first end portion 128$_L$ and the second end portion 128$_R$ may have substantially equal thicknesses. The curved shape of the second field plate 128 may reduce the capacitive coupling between the gate 126, the second field plate 128 and the horizontal portion 118H leading to improved transistor performance, for example, enabling the transistor structure 100 to operate at a higher frequency while maintaining the current gain of the transistor structure 100 at unity. The first field plate 118 may be electrically coupled to the source 122. In one embodiment, the second field plate 128 may have a thickness equal to the upper portion of the gate 126.

In one embodiment, the top surface 118$V_t$ of the vertical portion 118V of the first field plate 118 may be higher than the top surface 128*t*. In one embodiment, the top surface 120*t* of the drain 120 may be higher than the top surface 128*t*. In another embodiment, the top surface 118$V_t$ may be co-planar with the top surface 128*t*. The first field plate 118 effectively reduces capacitive coupling between the gate 126, the second field plate 128 and the drain 120.

The transistor structure 100 may include an insulating material 132 arranged over the source 122, the drain 120, the gate 126, the first field plate 118 and the second field plate 128. The insulating material 132 may have one or more layers. The first field plate 118 may be fully separated from the drain 120, the gate 126 and the second field plate 128 by the insulating material 132. The insulating material 132 may fully separate the source 122 from the gate 126.

The transistor structure 100 may include a buffer layer 110 and a channel layer 112 may be arranged on a top surface of the buffer layer 110. Although not shown, a substrate may be arranged below the buffer layer 110. A barrier layer 116 may be arranged on a top surface of the channel layer 112. The barrier layer 116 and the channel layer 112 may be made of semiconductor materials having different band gap energies. During transistor operation, a two-dimensional electron gas may form at the interface between the channel layer 112 and the barrier layer 116. A bottom surface 126*b* of the gate 126 may be arranged on a top surface of the barrier layer 116. For example, the bottom surface 126*b* of the gate 126 may directly contact the top surface of the barrier layer 116. A bottom surface 120*b* of the drain 120 and a bottom surface of the source 122 may be arranged on the top surface of the channel layer 112. For example, the bottom surface 120*b* of the drain 120 and the bottom surface of the source 122 may directly contact the top surface of the channel layer 112. The top surface 120*t* of the drain 120 and a top surface of the source 122 may be above the top surface of the barrier layer 116. In one embodiment, the horizontal portion 118H and the vertical portion 118V of the first field plate 118 may be spaced from the top surface of the barrier layer 116. A portion of the insulating material 132 may fully separate the horizontal portion 118H from the barrier layer 116, thereby protecting the top surface of the barrier layer 116. In an alternative embodiment, the horizontal portion 118H may be arranged on the top surface of the barrier layer 116, directly contacting the barrier layer 116. The insulating material 132 may be arranged on the top surface of the barrier layer 116.

The substrate may be made of silicon, silicon carbide, graphene, diamond, sapphire, or any composite substrate suitable for gallium nitride/aluminum gallium nitride epitaxy and the buffer layer 110 may be made of aluminum gallium nitride and aluminum nitride superlattices. The channel layer 112 may be made of gallium nitride in a preferred embodiment. In an alternative embodiment, the channel layer 112 may be made of gallium nitride, gallium arsenide (GaAs) or any other suitable III-V semiconductor material. The barrier layer 116 may be made of aluminum gallium nitride in a preferred embodiment. In an alternative embodiment, the barrier layer 116 may be made of aluminum nitride or a combination of aluminum gallium nitride and aluminum nitride. The insulating material 132 may be made of silicon dioxide, silicon nitride, or any other suitable dielectric material. The gate 126 may be made of titanium nitride, tantalum nitride, aluminum, copper, nickel, or its combination. The source 122 and the drain 120 may be made of layers of titanium/aluminum/titanium nitride, titanium/aluminum/titanium/gold, molybdenum/aluminum/molybdenum/gold, any other suitable metal, or its combination. The horizontal portion 118H of the first field plate 118 may be made of copper, aluminum, or any other suitable metal. The vertical portion 118V may be made of layers of titanium/aluminum/titanium nitride, titanium/aluminum/titanium/gold, molybdenum/aluminum/molybdenum/gold, any other suitable metal, or its combination. The second field plate 128 may be made of titanium nitride, tantalum nitride, aluminum, copper, nickel, or its combination. In one embodiment, the second field plate 128 and the gate 126 may be made of the same material.

Figure 1B:
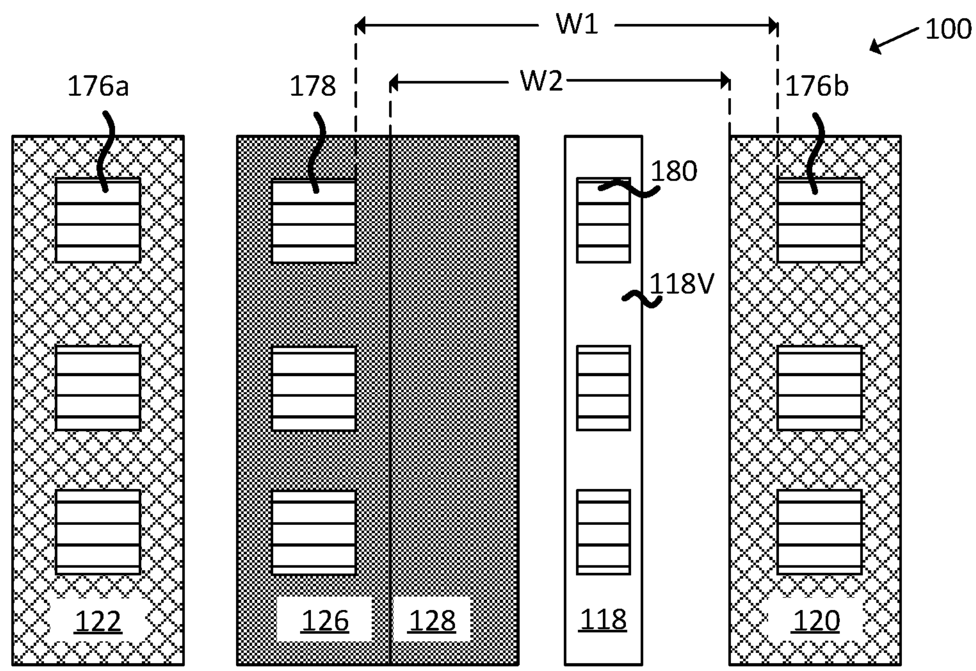
FIG. 1B shows a top down view of the transistor structure shown in FIG. 1A, according to an embodiment of the disclosure.

FIG. 1B shows a top down view of the transistor structure 100 shown in FIG. 1A, according to an embodiment of the disclosure. Referring to FIG. 1B, source contacts 176*a* may be arranged on the top surface of the source 122 and the source contacts 176*a* may have a smaller width than the top surface of the source 122. Gate contacts 178 having a smaller width than the upper portion of the gate 126 may be arranged on the top surface of the gate 126. There are no contacts over the second field plate 128 as the second field plate 128 may be directly contacting the gate 126. Contacts 180 having a smaller width than the top surface of the vertical portion 118V of the first field plate 118 may also be arranged on the top surface of the vertical portion 118V. For simplicity, only the top surface of the vertical portion 118V is shown in the top down view. Drain contacts 176*b* having a smaller width than the top surface of the drain 120 may be arranged on the top surface of the drain 120. The contacts 176*a*, 176*b*, 178 and 180 may be spaced from each other and may be arranged in the insulating material 132. A larger spacing W1 between the contacts 178 and 176*b* compared to a spacing W2 between the gate 126 and the drain 120 leads to less capacitive coupling between the contacts 178 and 176*b*. The contacts 180 may further reduce capacitive coupling between the gate 126 and the drain 120, acting like a Faraday cage to block electromagnetic radiation between the gate 126 and the drain 120. From a top down perspective, the source contacts 176*a*, drain contacts 176*b*, gate contacts 178, and contacts 180 may be rectangular, square, or any other suitable shape.

Figure 2:
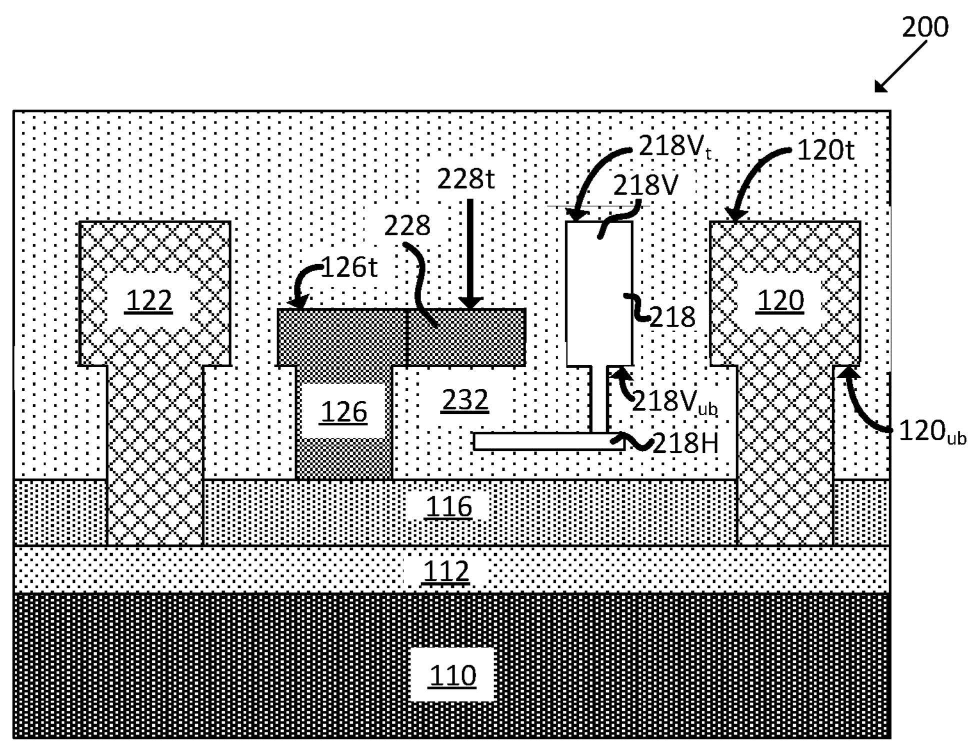
FIG. 2 shows a cross sectional view of a transistor structure, according to another embodiment of the disclosure.

The embodiments shown in FIG. 1A may be modified to form alternative embodiments without departing from the scope of the disclosure. For example, FIG. 2 shows a cross sectional view of a transistor structure 200, according to another embodiment of the disclosure. Like features in FIG. 1A may be indicated by like numerals in FIG. 2. Referring to FIG. 2, in contrast to the transistor structure 100, the transistor structure 200 includes a second field plate 228 having a top surface 228*t* co-planar with the top surface 126*t* of the gate 126. The second field plate 228 may be rectangular in shape. The transistor structure 200 has a first field plate 218 with a vertical portion 218V above a horizontal portion 218H. The vertical portion 218V may have an upper portion and a lower portion. The upper portion of the vertical portion 218V may be wider than the lower portion. The first field plate 218 may be arranged between the second field plate 228 and the drain 120. The drain 120 may have a wider upper portion above a lower portion. A top surface 120*t* of the upper portion of the drain 120 may be coplanar with a top surface 218$V_t$ of the upper portion of the vertical portion 218V. A bottom surface 218$V_{ub}$ of the upper portion of the vertical portion 218V may be coplanar with a bottom surface 120$_{ub}$ of the upper portion of the drain 120.

Figure 3:
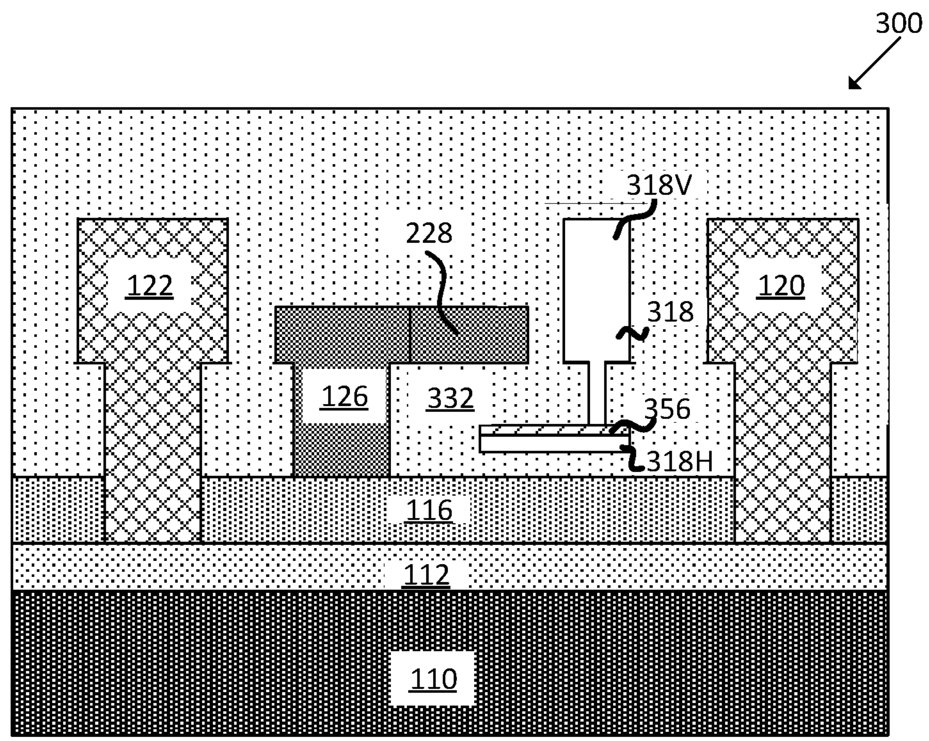
FIG. 3 shows a cross sectional view of a transistor structure, according to yet another embodiment of the disclosure.

FIG. 3 shows a cross sectional view of a transistor structure 300, according to yet another embodiment of the disclosure. Referring to FIG. 3, in contrast to the transistor structure 200, the transistor structure 300 may include an isolation layer 356 between a horizontal portion 318H and a vertical portion 318V of a first field plate 318. The isolation layer 356 may be arranged on a top surface of the horizontal portion 318H, fully separating, and electrically isolating the horizontal portion 318H from the vertical portion 318V. The vertical portion 318V may be biased differently from the horizontal portion 318H during the transistor structure 300 operation. The isolation layer 356 may be made of silicon nitride, silicon dioxide, or any other suitable dielectric material.

Figure 4:
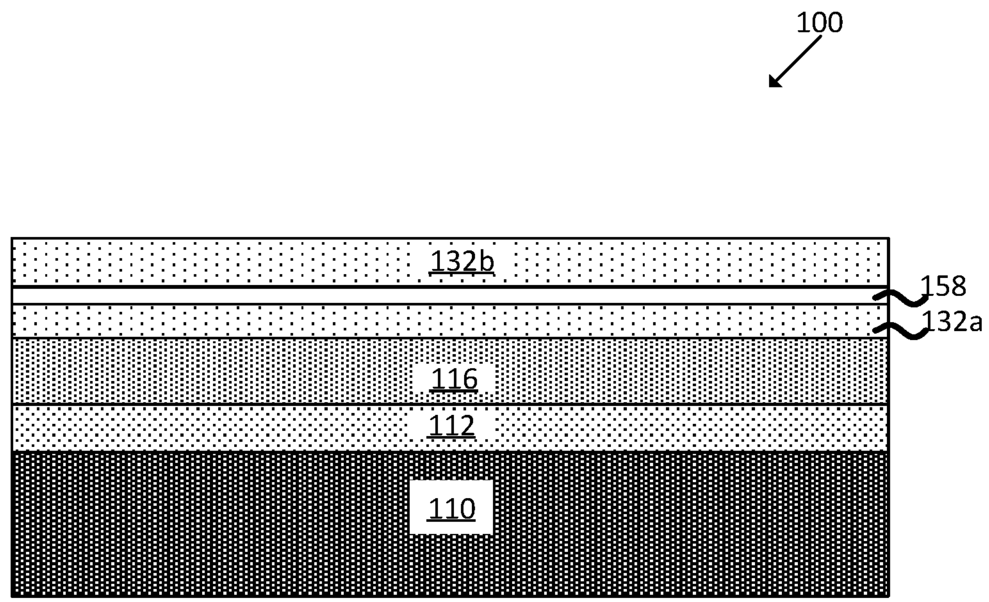
FIGS. 4 to 12 show a fabrication process flow for the transistor structure shown in FIG. 1A, according to some embodiments of the disclosure.

FIGS. 4 to 12 show a fabrication process flow for the transistor structure 100 shown in FIG. 1A, according to some embodiments of the disclosure. FIG. 4 shows a partially completed transistor structure 100 after formation of a buffer layer 110, a channel layer 112, a barrier layer 116, insulating material layers 132*a* and 132*b*, and a metal layer 158, according to an embodiment of the disclosure. Referring to FIG. 4, the buffer layer 110 may be formed on a substrate (not shown) by epitaxy, chemical vapor deposition, for example, metal oxide chemical vapor deposition, or any other suitable fabrication methods. The channel layer 112 may be formed on a top surface of the buffer layer 110 by epitaxial growth, molecular beam epitaxy, metal oxide chemical vapor deposition, plasma assisted molecular beam epitaxy, or any other suitable process. The barrier layer 116 may be formed on a top surface of the channel layer 112 by epitaxial growth, molecular beam epitaxy, metal oxide chemical vapor deposition, plasma assisted molecular beam epitaxy, or any other suitable process. The insulating material layer 132*a* may be formed on a top surface of the barrier layer 116 by depositing a layer of a suitable dielectric material, for example, silicon dioxide, silicon nitride, or any other suitable dielectric material, by atomic layer deposition, chemical vapor deposition, physical vapor deposition, or any other suitable deposition processes. The metal layer 158 may be formed on a top surface of the insulating material layer 132*a* by depositing a layer of a suitable metal, for example copper, aluminum, or any other suitable metal by electroplating, atomic layer deposition, physical vapor deposition, chemical vapor deposition, plasma enhanced chemical vapor deposition, or any other suitable deposition processes. The insulating material layer 132*b* may be formed on a top surface of the metal layer 158 by depositing a layer of a suitable dielectric material, for example, silicon dioxide, silicon nitride, or any other suitable dielectric material by atomic layer deposition, chemical vapor deposition, physical vapor deposition, or any other suitable deposition processes. In one embodiment, a thickness of the insulating material layer 132*b* measured from the top surface of the metal layer 158 to a top surface of the insulating material layer 132*b* may be approximately equal to a thickness of the insulating material layer 132*a*, measured from the top surface of the barrier layer 116 to the top surface of the insulating material layer 132*a*.

Figure 5:
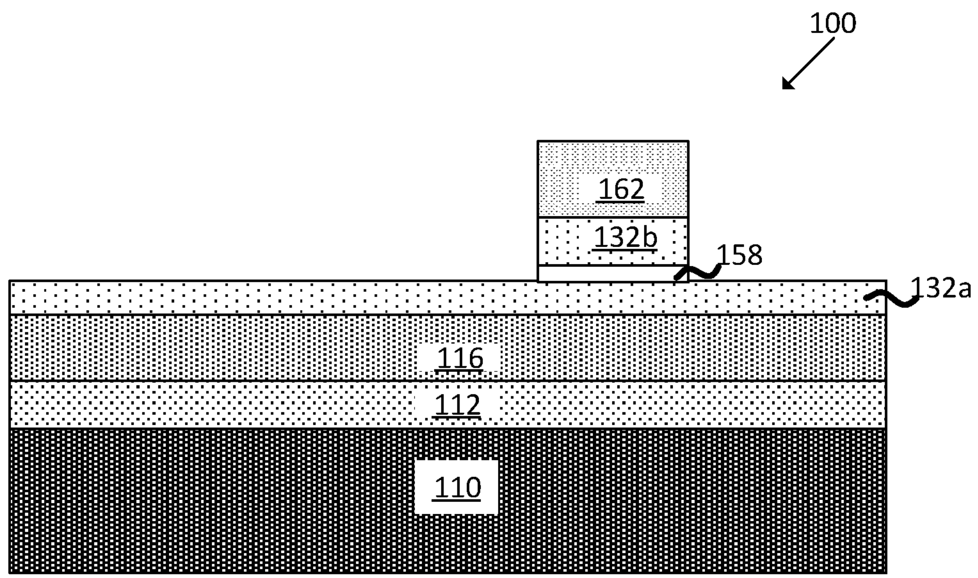

FIG. 5 shows a partially completed transistor structure 100 after patterning of the insulating material layer 132*b* and metal layer 158, according to an embodiment of the disclosure. Referring to FIG. 5, the insulating material layer 132*b* and metal layer 158 may be patterned by a photolithography process. In the photolithography process, a photoresist layer may be deposited on a top surface of the insulating material layer 132*b*. The photoresist layer may be exposed and developed to form a suitable photoresist pattern 162, exposing portions of the insulating material layer 132*b*. A wet etch or dry etch process may be used to remove portions of the insulating material layer 132*b* and the metal layer 158 not covered by the photoresist pattern 162, leaving behind another portion of the insulating material layer 132*b* and the metal layer 158 under the photoresist pattern 162. The photoresist pattern 162 may be removed subsequently.

Figure 6:
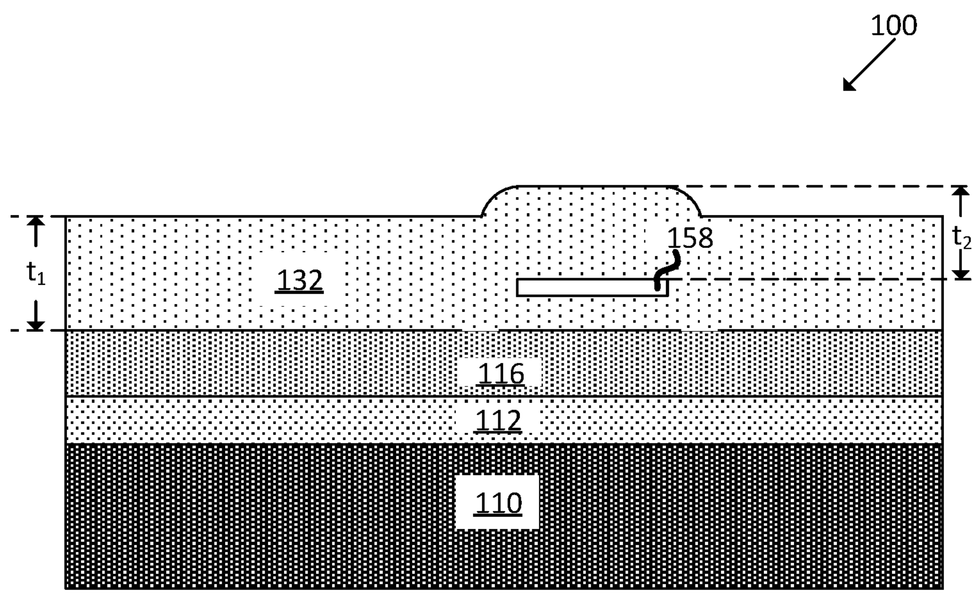

FIG. 6 shows a partially completed transistor structure 100 after formation of an insulating material 132, according to an embodiment of the disclosure. Referring to FIG. 6, the formation of the insulating material 132 may include uniformly depositing a layer of a suitable dielectric material, for example, silicon dioxide, silicon nitride, or any other suitable dielectric material, on a top surface of the insulating material layers 132*a* and 132*b*. The insulating material layers 132*a* and 132*b* may be referred to as insulating material 132. A thickness t1 of the insulating material 132 measured from the top surface of the barrier layer 116 to a top surface of the insulating material 132 is approximately equal to a thickness t2 of the insulating material 132 measured from the top surface of the metal layer 158 to a top surface of the insulating material 132 above the metal layer 158. The top surface of the insulating material 132 may be non-planar, forming a protrusion above the metal layer 158.

Figure 7:
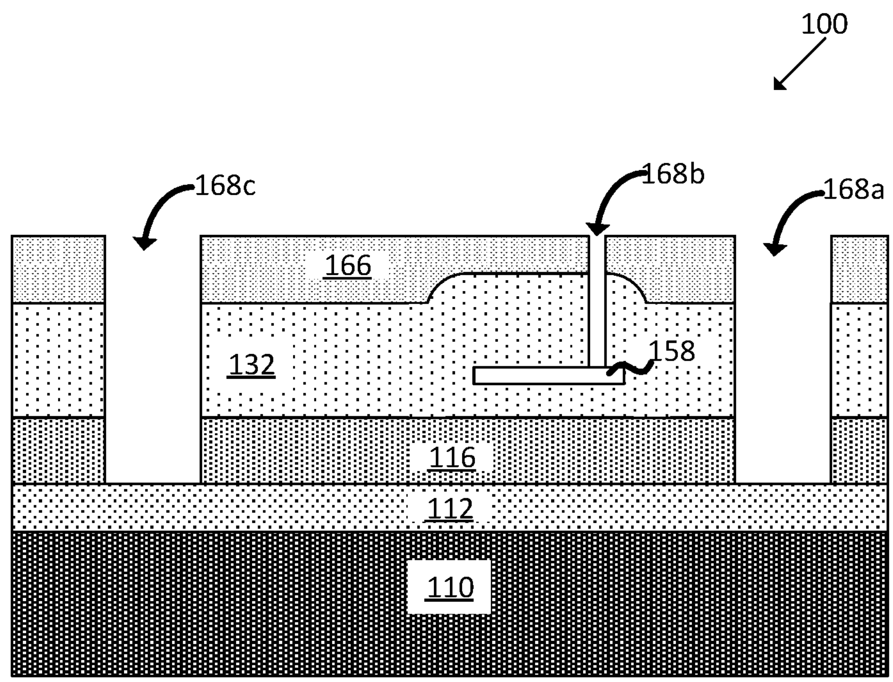

FIG. 7 shows a partially completed transistor structure 100 after formation of openings 168*a*, 168*b* and 168*c*, according to an embodiment of the disclosure. The openings 168*a*, 168*b* and 168*c* may be referred to as drain opening 168*a*, first field plate opening 168*b* and source opening 168*c*, respectively. The drain opening 168*a*, first field plate opening 168*b* and source opening 168*c* may be formed by depositing and patterning a layer of photoresist on the top surface of the insulating material 132 by a photolithography process to form a photoresist pattern 166. The photoresist pattern 166 may expose portions of the insulating material 132 laterally spaced from a first side and a second side of the metal layer 158 and a portion of the insulating material 132 above the metal layer 158. A wet etch or dry etch process may be used to remove a portion of the insulating material 132 and the barrier layer 116 not covered by the photoresist pattern 166 to form the drain opening 168*a* and the source opening 168*c*. The drain opening 168*a* may be laterally spaced from a first side of the metal layer 158. The source opening 168*c* may be laterally spaced from a second side of the metal layer 158. The source opening 168*c* may be spaced from the drain opening 168*a*. In one embodiment, the etching processes may be used to remove a portion of the insulating material 132 above the top surface of the metal layer 158 and not covered by the photoresist pattern 166 to form the first field plate opening 168*b*, exposing a portion of the metal layer 158. The metal layer 158 may be arranged between the source opening 168*c* and drain opening 168*a*. The photoresist pattern 166 may subsequently be removed.

Figure 8:
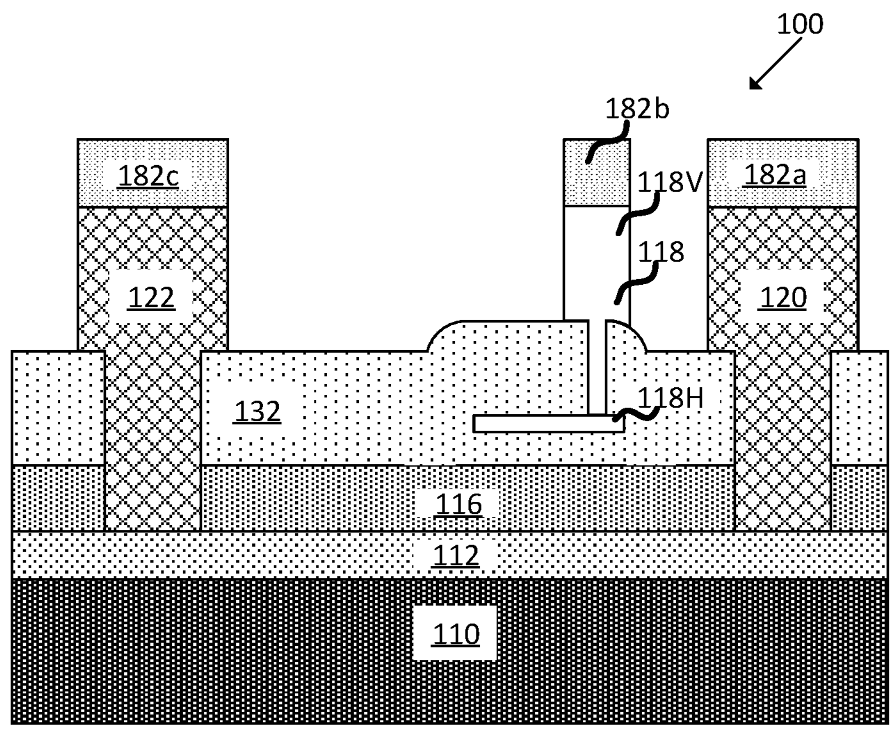

FIG. 8 shows a partially completed transistor structure 100 after formation of a source 122, a vertical portion 118V of the first field plate 118 and a drain 120, according to an embodiment of the disclosure. Referring to FIG. 8, the formation of the source 122, the vertical portion 118V of the first field plate 118 and the drain 120 includes depositing a layer of a suitable metal, for example, layers of titanium/aluminum/titanium nitride, titanium/aluminum/titanium/gold, molybdenum/aluminum/molybdenum/gold, any other suitable metal, or its combination in the source opening 168*c*, the first field plate opening 168*b* and the drain opening 168*a*, and over a top surface of the insulating material 132. A suitable planarization process, for example, chemical mechanical planarization, may be used to planarize a top surface of the metal layer. A layer of photoresist may be deposited, exposed, and developed to form suitable photoresist patterns 182*a*, 182*b* and 182*c* over the top surface of the metal layer above the drain opening 168*a*, the first field plate opening 168*b* and the source opening 168*c*, respectively. A wet etch or dry etch process may be used to remove portions of the metal layer not covered by the photoresist patterns 182*a-c*, leaving behind other portions of the metal layer below the photoresist pattern 182*a-c* to form the drain 120, vertical portion 118V of the first field plate 118 and source 122, respectively. The vertical portion 118V may have an upper portion. A portion of a bottom surface of the upper portion of the vertical portion 118*b* may be non-planar as it may be formed on the non-planar top surface of the insulating material 132. The metal layer 158 may be referred to as a horizontal portion 118H of the first field plate 118. The photoresist patterns 182*a-c* may subsequently be removed.

Figure 9:
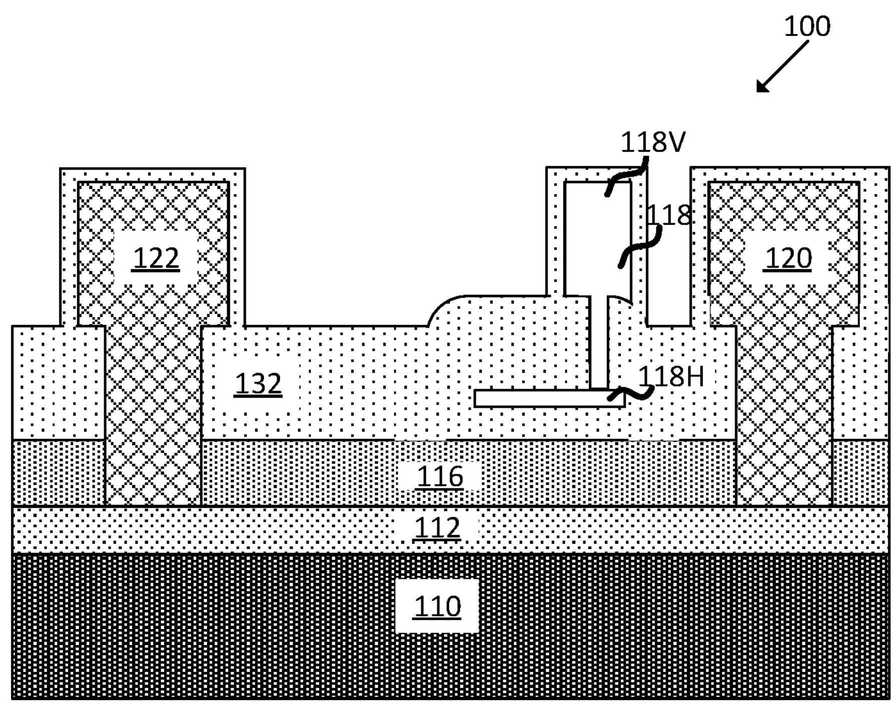

FIG. 9 shows a partially completed transistor structure 100 after formation of another layer of the insulating material 132 over the source 122, the first field plate 118 and the drain 120, according to an embodiment of the disclosure. Referring to FIG. 9, the formation of the layer of the insulating material 132 may include depositing a layer of a suitable dielectric material, for example, silicon dioxide, silicon nitride, or any other suitable dielectric material over a top surface and side surfaces of an upper portion of the source 122, the vertical portion 118V of the first field plate 118, and the drain 120. The deposition process may be by atomic layer deposition, chemical vapor deposition, physical vapor deposition and any other suitable deposition processes.

Figure 10:
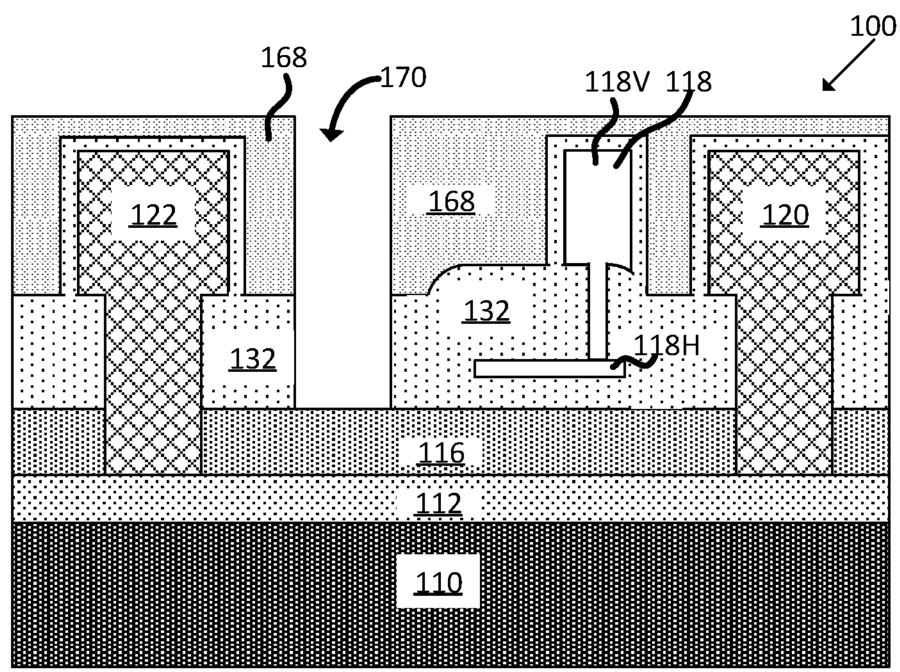

FIG. 10 shows a partially completed transistor structure 100 after formation of a photoresist layer 168 and an opening 170, according to an embodiment of the disclosure. The photoresist layer 168 may be deposited over a top surface of the insulating material 132. An opening 170 may be formed in the photoresist layer 168 and the insulating material 132 between the source 122 and the first field plate 118. The opening 170 may expose a portion of the barrier layer 116. The formation of the opening 170 may include exposing and developing the photoresist layer 168 by a photolithography process to form an opening in the photoresist layer 168, thereby exposing a portion of the insulating material 132. A wet etch or dry etch process may be used to remove the exposed portion of the insulating material 132 to form the opening 170. The photoresist layer 168 may subsequently be removed, leaving behind the opening 170 in the portion of the insulating material 132. In an alternative embodiment, the vertical portion 118V of the first field plate 118 may be formed together with the gate 126 and the second field plate 128. For example, the first field plate opening 168*b* shown in FIG. 7 may be formed together with the opening 170.

Figure 11:
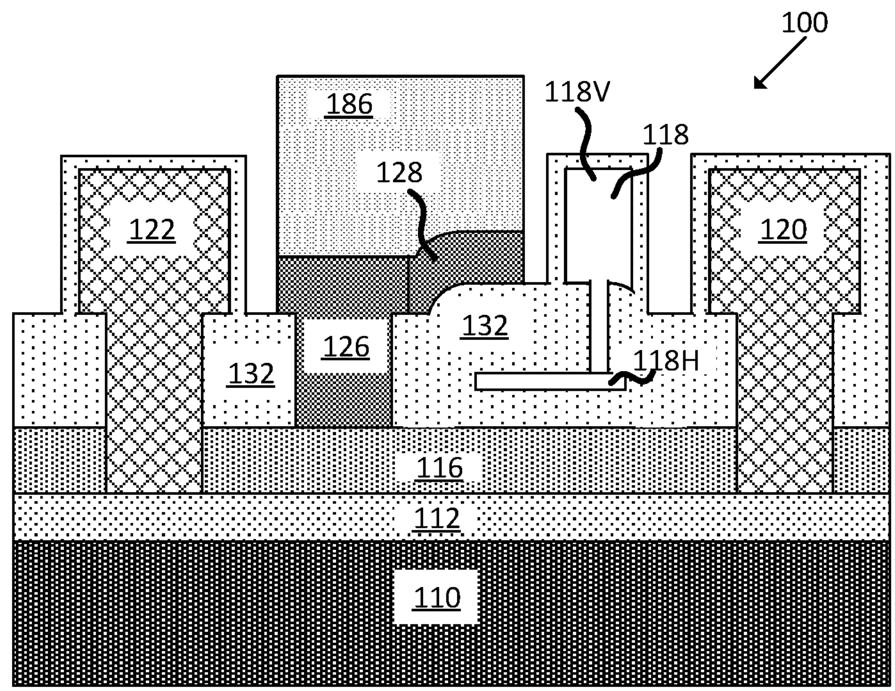

FIG. 11 shows a partially completed transistor structure 100 after formation of a gate 126 and a second field plate 128, according to an embodiment of the disclosure. Referring to FIG. 11, the formation of the gate 126 and the second field plate 128 may include depositing a layer of a suitable metal, for example, titanium nitride, tantalum nitride, aluminum, copper, nickel, or its combination in the opening 170 and above a top surface of insulating material 132. A layer of photoresist may be deposited over a top surface of the metal layer, exposed and developed to form a photoresist pattern 186 on the top surface of the metal layer above the opening 170 and partially overlapping the horizontal portion 118H of the first field plate 118. A wet etch or dry etch process may be used to remove a portion of the metal layer not covered by the photoresist pattern 186, leaving behind another portion of the metal layer under the photoresist pattern 186 to form the gate 126 and the second field plate 128. The photoresist pattern 186 may subsequently be removed.

Figure 12:
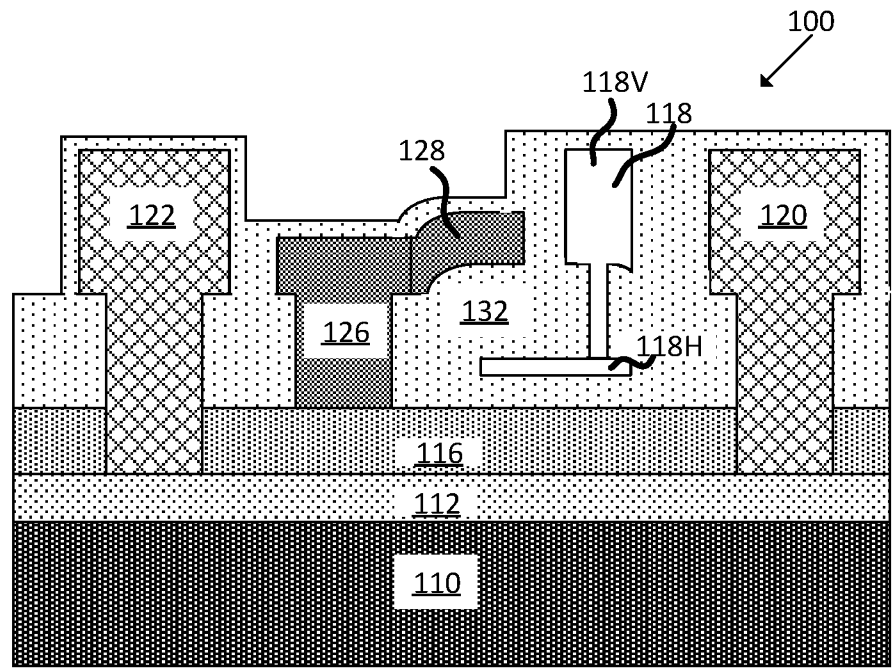

FIG. 12 shows a partially completed transistor structure 100 after formation of another layer of the insulating material 132 over the gate 126 and the second field plate 128, according to an embodiment of the disclosure. Referring to FIG. 12, the formation of the layer of the insulating material 132 may include depositing a layer of a suitable dielectric material, for example, silicon dioxide, silicon nitride, or any other suitable dielectric material over top surfaces and side surfaces of the gate 126 and the second field plate 128. The deposition process may be by atomic layer deposition, chemical vapor deposition, physical vapor deposition, or any other suitable deposition processes.

The process may continue to form the transistor structure 100 shown in FIG. 1A. Referring to FIG. 1A, another layer of the insulating material 132 may be formed on a top surface of the insulating material 132. A suitable planarization process, for example, chemical mechanical planarization, may be used to planarize a top surface of the insulating material 132. Although not shown, openings may be made in the insulating material 132 above the source 122, gate 126, vertical portion 118V of the first field plate 118, and drain 120. A layer of photoresist may be deposited over a top surface of the insulating material 132, exposed and developed to form a suitable photoresist pattern. A wet etch or dry etch process may be used to remove portions of the insulating material 132 not covered by the photoresist pattern to form the openings above the source 122, gate 126, vertical portion 118V of the first field plate 118, and drain 120. The photoresist pattern may subsequently be removed. A layer of a suitable metal, for example, tungsten, or any other suitable metal, may be deposited in the openings in the insulating material 132. A suitable planarization process, for example, chemical mechanical planarization, may be used to remove the tungsten layer from the top surface of the insulating material 132, leaving behind the tungsten layer in the openings above the source 122, gate 126, vertical portion 118V of the first field plate 118, and drain 120 to form the source contact 176*a*, gate contact 178, contact 180, and drain contact 176*b*, respectively, shown in FIG. 1B. Subsequent fabrication processes, for example, during a back end of line process for the transistor structure 100 may add additional metal layers to the contact 180. The term “back end of line” may refer to a semiconductor manufacturing process where interconnects are formed in a device. The contact 180 and the additional metal layers above the contact 180 may further reduce capacitive coupling between the gate 126 and the drain 120.

Figure 13:
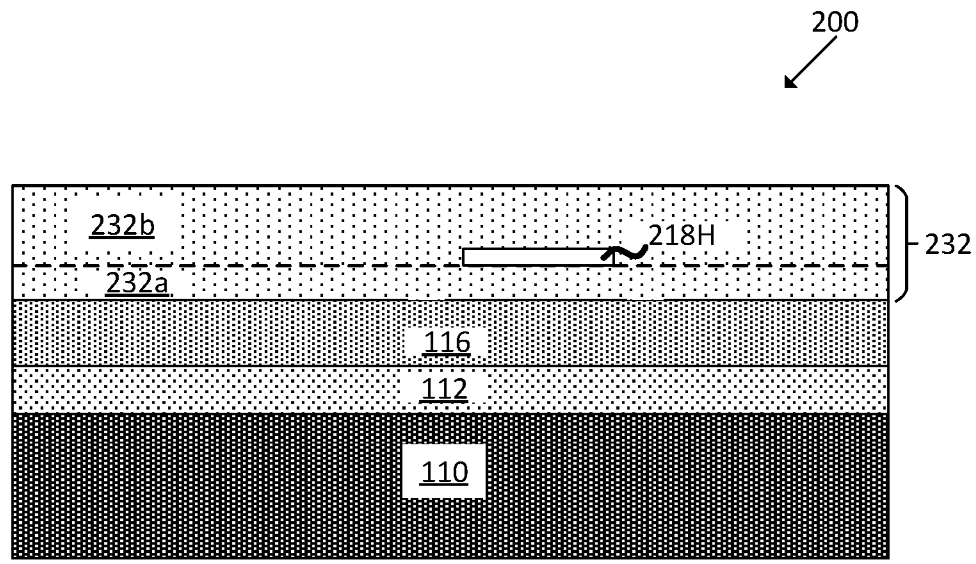
FIGS. 13 and 14 show a fabrication process flow for the transistor structure shown in FIG. 2, according to some embodiments of the disclosure.
Figure 14:
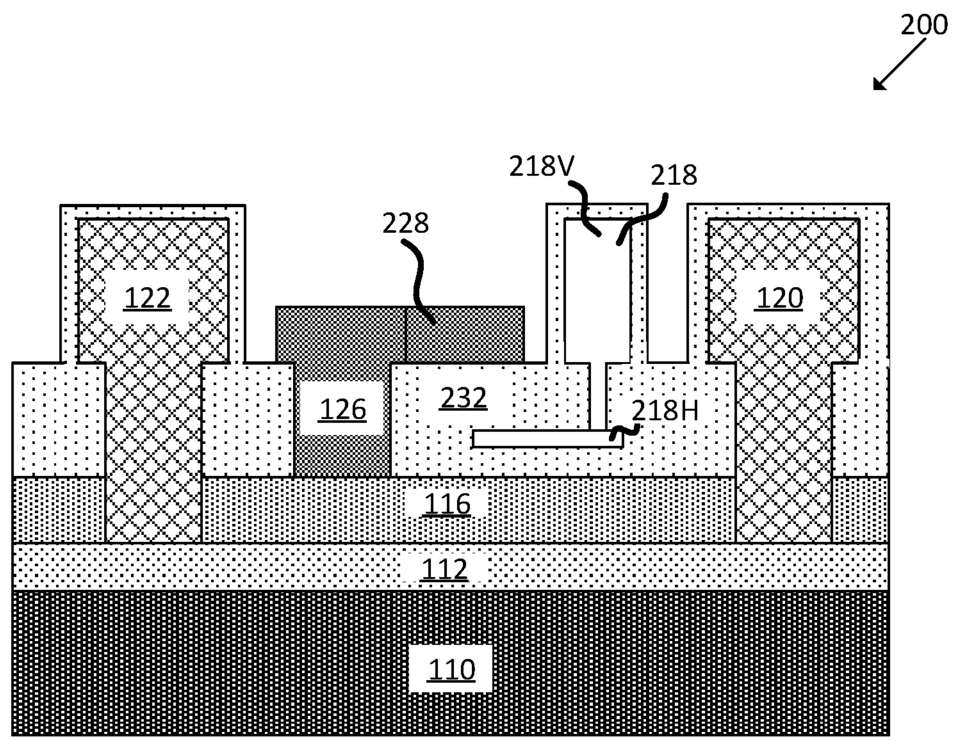

FIGS. 13 and 14 show a fabrication process flow for the transistor structure 200 shown in FIG. 2, according to some embodiments of the disclosure. FIG. 13 shows a partially completed transistor structure 200 after formation of a buffer layer 110, a channel layer 112, a barrier layer 116, an insulating material 232 and a horizontal portion 218H of a first field plate 218, according to an embodiment of the disclosure. The insulating material 232 may have one or more layers. Referring to FIG. 13, the formation of the buffer layer 110, channel layer 112, barrier layer 116, and insulating material layer 232*a* of the transistor structure 200 may be like the formation of the buffer layer 110, channel layer 112, barrier layer 116, and insulating material layer 132*a* of the transistor structure 100, respectively, shown in FIG. 4. The formation of the horizontal portion 218H of the first field plate 218 of the transistor structure 200 may be like the formation of the metal layer 158 of the transistor structure 100 shown in FIG. 5. The formation of the insulating material layer 232*b* may include depositing a layer of a suitable dielectric material, for example, silicon dioxide, silicon nitride, or any other suitable dielectric material over the insulating material layer 232*a* and the horizontal portion 218H of the first field plate 218. A suitable planarization process, for example, chemical mechanical planarization, may be used to planarize a top surface of the insulating material layer 232*b*. The insulating material layers 232*a* and 232*b* may be referred to as insulating material 232.

FIG. 14 shows a partially completed transistor structure 200 after formation of a source 122, a gate 126, a first field plate 218, a second field plate 228 and a drain 120, according to an embodiment of the disclosure. Referring to FIG. 14, the formation of the source 122, first field plate 218 and drain 120 of the transistor structure 200 may be like the formation of the source 122, first field plate 118 and drain 120 of the transistor structure 100, respectively, shown in FIGS. 7 and 8, except that an upper portion of a vertical portion 218V of the first field plate 218 may have a bottom surface that is co-planar with a bottom surface of an upper portion of the drain 120. Following the formation of the source 122, drain 120 and the first field plate 218, another layer of the insulating material 232 may be deposited over an upper portion of the source 122, the upper portion of the vertical portion 218V and the upper portion of the drain 120, which may be like the fabrication process shown in FIG. 9. An opening may be made in a portion of the insulating material 232 between the source 122 and the first field plate 218, which may be like the fabrication process shown in FIG. 10. A gate 126 may be formed in the opening between source 122 and the first field plate 218. The formation of the gate 126 and the second field plate 228 of the transistor structure 200 may be like the formation of the gate 126 and the second field plate 128 of the transistor structure 100, respectively, shown in FIG. 11, except that a top surface of the second field plate 228 may be co-planar with a top surface of the gate 126 and the second field plate 228 may be rectangular in shape.

The process may continue to form the transistor structure 200 shown in FIG. 2. Referring to FIG. 2, another layer of the insulating material 232 may be deposited over the gate 126, the second field plate 228, the source 122, the first field plate 218 and the drain 120 followed by planarization.

Figure 15:
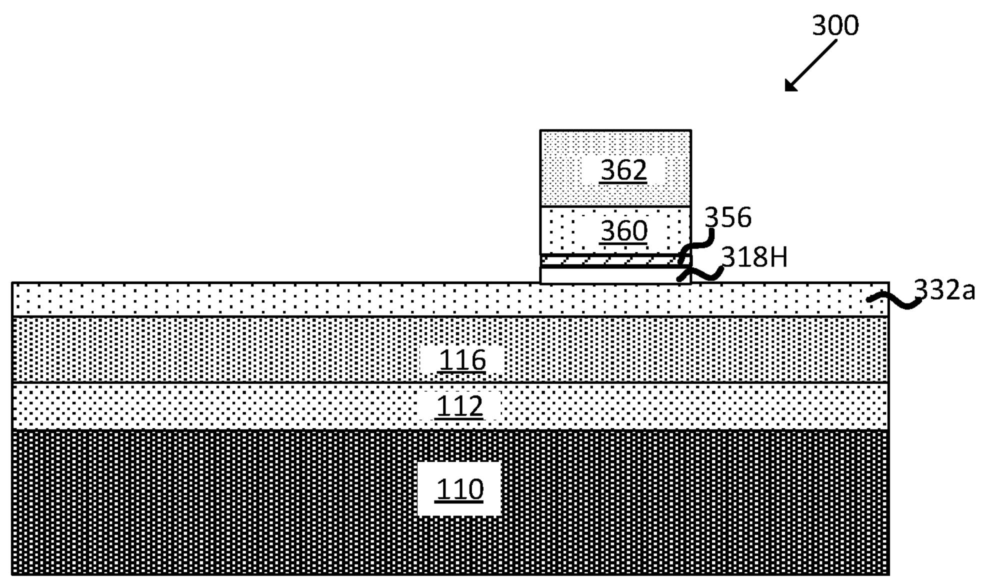
FIGS. 15 and 16 show a fabrication process flow for the transistor structure shown in FIG. 3, according to some embodiments of the disclosure.
Figure 16:
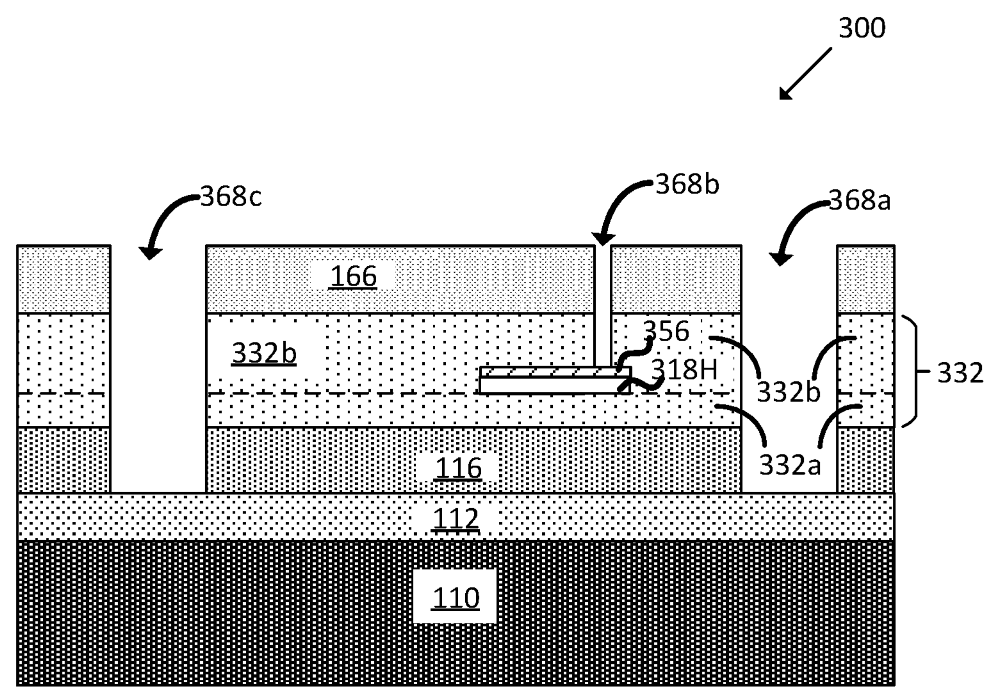

FIGS. 15 and 16 show a fabrication process flow for the transistor structure 300 shown in FIG. 3, according to some embodiments of the disclosure. FIG. 15 shows a partially completed transistor structure 300 after formation of a buffer layer 110, a channel layer 112, a barrier layer 116, an insulating material layer 332*a*, a horizontal portion 318H of a first field plate 318, an isolation layer 356 and a dielectric layer 360, according to an embodiment of the disclosure. Referring to FIG. 15, the formation of the buffer layer 110, channel layer 112, barrier layer 116 and insulating material layer 332*a* of the transistor structure 300 may be like the formation of the buffer layer 110, channel layer 112, barrier layer 116 and insulating material layer 132*a* of the transistor structure 100, respectively, shown in FIG. 4. The formation of the horizontal portion 318H of the first field plate 318 may include depositing a layer of a suitable metal, for example, copper, aluminum, or any other suitable metal on a top surface of the insulating material layer 332*a*. A first layer of a suitable dielectric material, for example, silicon nitride, silicon dioxide, or any other suitable dielectric material may be deposited over the metal layer. A second layer of a suitable dielectric material, for example, silicon dioxide, silicon nitride, or any other suitable dielectric material may be deposited on a top surface of the first layer of dielectric material. A layer of photoresist may be deposited on a top surface of the second layer of dielectric material. The photoresist layer may be exposed and developed to form a photoresist pattern 362, exposing portions of the second layer of dielectric material. A wet etch or dry etch process may be used to remove a portion of the first and second layers of dielectric material and metal layer not covered by the photoresist pattern 362, leaving behind another portion of the metal layer and first and second dielectric layers under the photoresist pattern 362 to form the horizontal portion 318H of the first field plate 318, isolation layer 356 and dielectric layer 360, respectively. The photoresist pattern 362 may subsequently be removed.

FIG. 16 shows a partially completed transistor structure 300 after formation of an insulating material 332 and openings 368*a*, 368*b* and 368*c*, according to an embodiment of the disclosure. Referring to FIG. 16, the formation of the insulating material layer 332*b* of the transistor structure 300 may be like the formation of the insulating material layer 232*b* of the transistor structure 200 shown in FIG. 13, except that the insulating material layer 332*b* is formed on a top surface of the isolation layer 356. The insulating material layers 332*a* and 332*b* may be referred to as the insulating material 332. The insulating material 332 may have one or more layers. A layer of photoresist may be deposited over a top surface of the insulating material 332. The photoresist layer may be exposed and developed to form a photoresist pattern 166, exposing portions of the top surface of the insulating material 332 laterally spaced from a first side and a second side of the horizontal portion 318H. The photoresist pattern 166 also exposed a portion of the top surface of the insulating material 332 above the horizontal portion 318H. A wet etch or dry etch process may be used to remove the portion of the insulating material 332 and barrier layer 116 not covered by the photoresist pattern 166 and laterally spaced from the first side of the horizontal portion 318H to form a drain opening 368*a*. The etching processes may also remove another portion of the insulating material 332 above the isolation layer 356 to form a first field plate opening 368*b*. The first field plate opening 368*b* may expose a portion of the isolation layer 356. The etching processes may also remove yet another portion of the insulating material 332 and the barrier layer 116 laterally spaced from the second side of the horizontal portion 318H to form a source opening 368*c*. The photoresist pattern 166 may subsequently be removed.

The process may continue to form the transistor structure 300 shown in FIG. 3. Referring to FIG. 3, the formation of the source 122, drain 120 and first field plate 318 of the transistor structure 300 may be like the formation of the source 122, drain 120 and first field plate 218 of the transistor structure 200, respectively, shown in FIG. 14, except that a vertical portion 318V of the first field plate 318 may be formed above the isolation layer 356 and directly contact the isolation layer 356. Another layer of the insulating material 332 may be deposited over the source 122, first field plate 318 and drain 120. The formation of the gate 126 and the second field plate 228 of the transistor structure 300 may be like the formation of like features of the transistor structure 200 shown in FIG. 14. Another layer of the insulating material 332 may be deposited over the gate 126, second field plate 228, source 122, first field plate 318 and drain 120 followed by planarization.

The terms “first”, “second”, “third”, and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms “left”, “right”, “front”, “back”, “top”, “bottom”, “over”, “under”, and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms “comprise”, “include”, “have”, and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A transistor structure comprising:

a source;

a drain;

a gate between the source and the drain, wherein the gate has a top surface, the gate is T-shaped and having an upper portion and a lower portion, wherein the upper portion is wider than the lower portion;

a first field plate between the gate and the drain, wherein the first field plate is L-shaped and having a vertical portion over a horizontal portion, and a top surface of the vertical portion of the first field plate is at least as high as the top surface of the gate; and a second field plate connected to the upper portion of the gate, wherein the second field plate partially overlaps the horizontal portion of the first field plate.

2. The transistor structure of claim 1, wherein the top surface of the vertical portion of the first field plate is higher than the top surface of the gate.

3. The transistor structure of claim 2, wherein the top surface of the vertical portion of the first field plate is co-planar with a top surface of the drain.

4. The transistor structure of claim 1, wherein the horizontal portion of the first field plate extends under the upper portion of the gate.

5. The transistor structure of claim 1, wherein the second field plate has a curved shape.

6. The transistor structure of claim 5, wherein a top surface of the second field plate is higher than the top surface of the gate.

7. The transistor structure of claim 1, wherein the second field plate has a top surface co-planar with the top surface of the gate.

8. The transistor structure of claim 6, wherein the top surface of the vertical portion of the first field plate is higher than the top surface of the second field plate.

9. The transistor structure of claim 6, wherein a top surface of the drain is higher than the top surface of the second field plate.

10. The transistor structure of claim 2, further comprising:
a buffer layer;
a channel layer over the buffer layer; and
a barrier layer over the channel layer, wherein a bottom surface of the drain is on the channel layer and a top surface of the drain is above the barrier layer.

11. The transistor structure of claim 10, wherein a bottom surface of the gate is on the barrier layer.

12. The transistor structure of claim 10, further comprising:
an insulating material over the barrier layer, the first field plate, the second field plate, the gate, and the drain, wherein the first field plate is fully separated from the second field plate, the gate, and the drain by the insulating material.

13. The transistor structure of claim 1, further comprising:
an isolation layer between the horizontal portion of the first field plate and the vertical portion of the first field plate, wherein the horizontal portion is fully separated from the vertical portion by the isolation layer.

14. A transistor structure comprising:
a source;
a drain;
a gate between the source and the drain, wherein the gate has a top surface;
a first field plate between the gate and the drain, the first field plate is L-shaped and having a vertical portion over a horizontal portion, the vertical portion of the first field plate having a lower portion and an upper portion, the upper portion of the vertical portion of the first field plate is wider than the lower portion, and a top surface of the vertical portion of the first field plate is at least as high as the top surface of the gate, and wherein the top surface of the vertical portion of the first field plate is co-planar with a top surface of the drain; and
a second field plate, wherein the second field plate is connected to the gate and the second field plate partially overlaps the horizontal portion of the first field plate.

15. The transistor structure of claim 14, wherein the top surface of the vertical portion of the first field plate is higher than the top surface of the gate.

16. A method of fabricating a transistor structure comprising:
forming a source and a drain;
forming a first field plate between the source and the drain, wherein the first field plate is L-shaped and having a horizontal portion below a vertical portion, the vertical portion of the first field plate having a top surface;
forming a gate between the first field plate and the source, the gate has a top surface, wherein the gate is T-shaped and having an upper portion and a lower portion, wherein the upper portion is wider than the lower portion, and wherein the top surface of the vertical portion of the first field plate is at least as high as the top surface of the gate; and
forming a second field plate, wherein the second field plate is connected to the upper portion of the gate and the second field plate partially overlaps the horizontal portion of the first field plate.

17. The method of claim 16, wherein forming the first field plate further comprises:
forming a barrier layer;
forming the horizontal portion of the first field plate over the barrier layer; and
forming the vertical portion of the first field plate above the horizontal portion, wherein the first field plate is spaced from the source and the drain, the first field plate is spaced further from the source than the drain and the top surface of the vertical portion of the first field plate is co-planar with a top surface of the drain.

18. The transistor structure of claim 1, further comprising:
gate contacts on the top surface of the gate, and wherein no contacts are disposed on the second field plate.

19. The transistor structure of claim 14, further comprising:
gate contacts on the top surface of the gate, and wherein no contacts are disposed on the second field plate.

20. The transistor structure of claim 1, further comprising:
contacts disposed on the top surface of the vertical portion of the first field plate.

* * * * *